(12) United States Patent
Hiraguri et al.

(10) Patent No.: US 11,485,019 B2
(45) Date of Patent: Nov. 1, 2022

(54) INSPECTION SYSTEM

(71) Applicant: KABUSHIKI KAISHA TOSHIBA, Minato-ku (JP)

(72) Inventors: Kazuma Hiraguri, Yokohama (JP); Hiroaki Kuwahara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 77 days.

(21) Appl. No.: 16/936,896

(22) Filed: Jul. 23, 2020

(65) Prior Publication Data

US 2020/0353623 A1    Nov. 12, 2020

Related U.S. Application Data

(62) Division of application No. 16/171,583, filed on Oct. 26, 2018, now Pat. No. 10,759,057.

(30) Foreign Application Priority Data

Oct. 31, 2017   (JP) .............................. JP2017-211304

(51) Int. Cl.
  *B25J 9/16*   (2006.01)
  *G01R 31/34*   (2020.01)
  (Continued)

(52) U.S. Cl.
  CPC .............. *B25J 9/1697* (2013.01); *G01B 5/14* (2013.01); *G01B 7/14* (2013.01); *G01B 11/14* (2013.01);
  (Continued)

(58) Field of Classification Search
  None
  See application file for complete search history.

(56) References Cited

U.S. PATENT DOCUMENTS

| 2002/0135383 A1 | 3/2002 | Haeusermann et al. |
| 2008/0087112 A1 | 4/2008 | Bagley et al. |
| (Continued) | | |

FOREIGN PATENT DOCUMENTS

| JP | 60-15780 | 1/1985 |
| JP | 2-27408 | 1/1990 |
| (Continued) | | |

*Primary Examiner* — Idowu O Osifade
(74) *Attorney, Agent, or Firm* — Oblon, McClelland, Maier & Neustadt, L.L.P.

(57) ABSTRACT

According to one embodiment, an inspection system inspects equipment including a first structural object and a second structural object. The first structural object extends in a first direction. The second structural object is provided around the first structural object. The second structural object has a first surface opposing the first structural object. A first protrusion is provided in the first surface. The first protrusion extends in the first direction. The system includes a robot and a controller. The robot includes an imager. The robot moves between the first structural object and the second structural object. The imager images the first protrusion. The controller detects, from a first image acquired by the imager, a first edge portion of the first protrusion in a circumferential direction around the first direction. The controller controls a movement of the robot by using the detected first edge portion.

22 Claims, 9 Drawing Sheets

(51) Int. Cl.
  G01N 27/9013  (2021.01)
  H02K 15/02   (2006.01)
  G01B 7/14    (2006.01)
  G01B 5/14    (2006.01)
  H02K 15/00   (2006.01)
  G01B 11/14   (2006.01)

(52) U.S. Cl.
  CPC ........... G01N 27/902 (2013.01); G01R 31/34 (2013.01); H02K 15/00 (2013.01); H02K 15/02 (2013.01); G05B 2219/37208 (2013.01); H02K 2201/03 (2013.01)

(56)            References Cited

U.S. PATENT DOCUMENTS

| 2008/0087113 | A1 | 4/2008 | Bagley et al. |
| 2013/0047748 | A1 | 2/2013 | Visintin |
| 2016/0131595 | A1 | 5/2016 | Miasnikov et al. |
| 2019/0329399 | A1* | 10/2019 | Mizuno ................. B62D 55/10 |

FOREIGN PATENT DOCUMENTS

| JP | 2017-20972 | 1/2017 |
| WO | WO 2015/095543 A1 | 6/2015 |
| WO | WO 2016/081702 A1 | 5/2016 |
| WO | WO 2016/138529 A1 | 9/2016 |

\* cited by examiner

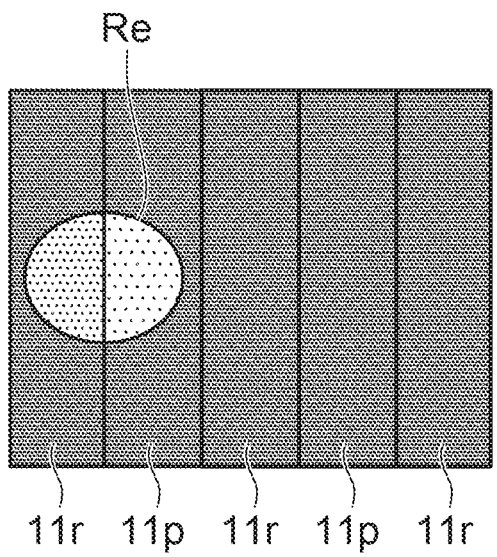
FIG. 6A
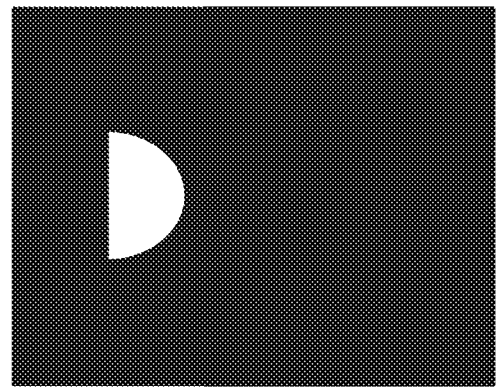
FIG. 6B
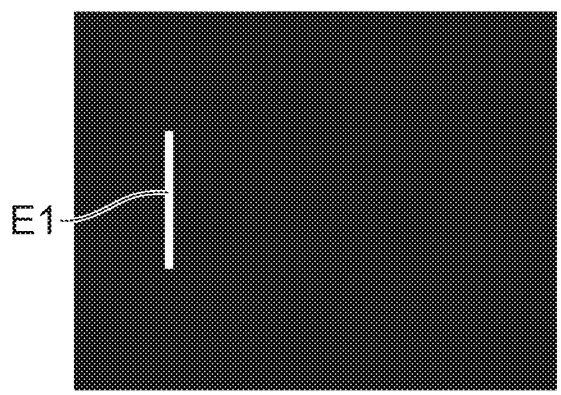
FIG. 6C
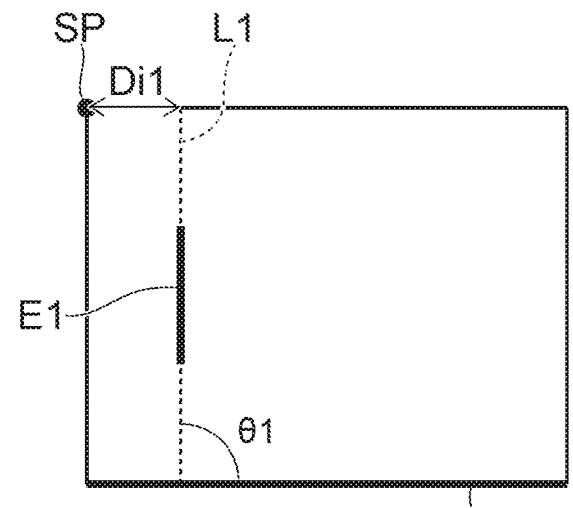
FIG. 6D
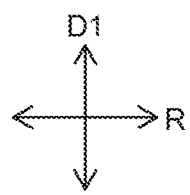

INSPECTION SYSTEM

CROSS-REFERENCE TO RELATED APPLICATIONS

This application is a divisional of U.S. application Ser. No. 16/171,583 filed Oct. 26, 2018, which is based upon and claims the benefit of priority from Japanese Patent Application No. 2017-211304, filed on Oct. 31, 2017; the entire contents of each of which are incorporated herein by reference.

FIELD

Embodiments described herein relate generally to an inspection system.

BACKGROUND

An inspection system has been proposed that uses a robot to inspect the gap between a rotor and a stator of a generator. The robot performs the inspection by moving along the axial direction of the rotor. To perform the inspection with higher reliability, it is desirable to reduce the tilt of the movement direction of the robot with respect to the axial direction and reduce the shift of the position of the robot in the rotation direction of the rotor.

BRIEF DESCRIPTION OF THE DRAWINGS

FIGS. 6A to 6D are schematic views illustrating the processing according to the inspection system according to the embodiment;

DETAILED DESCRIPTION

According to one embodiment, an inspection system inspects equipment including a first structural object and a second structural object. The first structural object extends in a first direction. The second structural object is provided around the first structural object. The second structural object has a first surface opposing the first structural object. A first protrusion is provided in the first surface. The first protrusion extends in the first direction. The system includes a robot and a controller. The robot includes an imager. The robot moves between the first structural object and the second structural object. The imager images the first protrusion. The controller detects, from a first image acquired by the imager, a first edge portion of the first protrusion in a circumferential direction around the first direction. The controller controls a movement of the robot by using the detected first edge portion. An inspection system according to an embodiment uses a robot to inspect an equipment interior. The equipment includes a first structural object and a second structural object. The robot moves through a gap between the first structural object and the second structural object. Here, the case is described where the inspection of a generator interior is performed by the robot.

The schematic configuration of the generator will now be described.

Figure 1A:
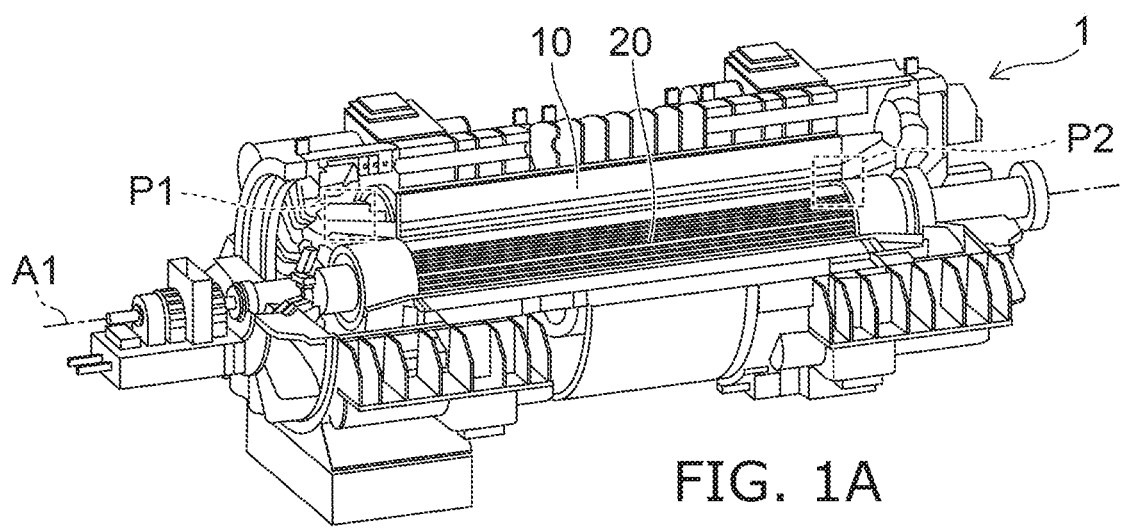
FIGS. 1A to 1C are schematic views illustrating the generator.
Figure 1B:
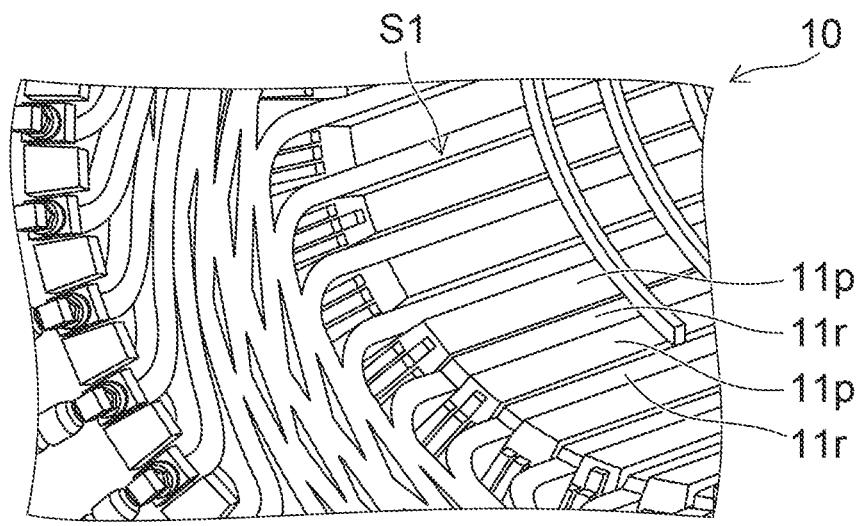
Figure 1C:
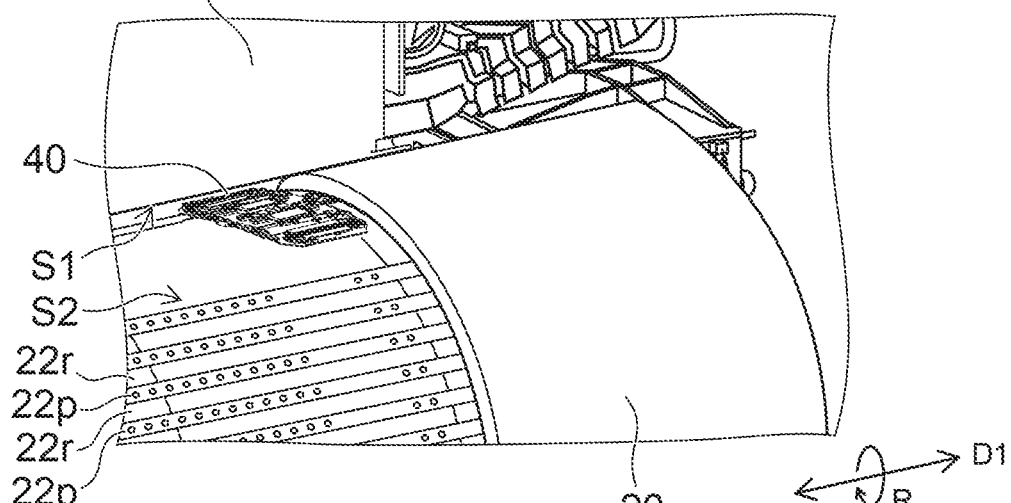

FIGS. 1A to 1C are schematic views illustrating the generator.

FIG. 1B is a perspective view in which portion P1 of FIG. 1A is enlarged. FIG. 1C is a perspective view in which portion P2 of FIG. 1A is enlarged. A portion of the generator 1 is not illustrated in FIG. 1A to illustrate the internal structure of the generator 1.

As illustrated in FIG. 1A, the generator 1 (an example of the equipment) includes a stator 10 (an example of the second structural object) and a rotor 20 (an example of the first structural object). The rotor 20 rotates with a first rotation axis µl at the center. The stator 10 is provided around the rotor 20. The stator 10 and the rotor 20 have columnar configurations extending in a first direction D1 parallel to the first rotation axis µl. The direction from the stator 10 toward the rotor 20 is perpendicular to the first direction D1.

As illustrated in FIG. 1B and FIG. 1C, the stator 10 has a first surface S1 opposing the rotor 20. As illustrated in FIG. 1C, the rotor 20 has a second surface S2 opposing the stator 10. The first surface S1 and the second surface S2 are substantially circular columnar surfaces.

As illustrated in FIG. 1B, multiple first protrusions 11p and multiple first recesses 11r exist in the first surface S1 of the stator 10. The multiple first protrusions 11p and the multiple first recesses 11r extend along the first direction D1. The multiple first protrusions 11p and the multiple first recesses 11r are provided alternately along a rotation direction R of the rotor 20 (the circumferential direction around the first direction D1).

For example, a coil or a wedge (a fixing member) covering a coil is exposed at the bottom surface of the first recess 11r. For example, the first protrusion 11p is a portion of an iron core and protrudes toward the rotor 20 with respect to the first recess 11r. Or, a portion of an iron core may be exposed at the bottom surface of the first recess 11r; and the first protrusion 11p may be at least a portion of a wedge protruding with respect to the iron core.

The configuration of the stator 10 is arbitrary as long as the multiple first protrusions 11p and the multiple first recesses 11r are provided in the first surface S1.

As illustrated in FIG. 1C, multiple second protrusions 22p and multiple second recesses 22r exist in the second surface S2 of the rotor 20. The multiple second protrusions 22p and the multiple second recesses 22r extend along the first direction D1. The multiple second protrusions 22p and the multiple second recesses 22r are provided alternately along the rotation direction R.

For example, a portion of an iron core is exposed at the bottom surface of the second recess 22r. The second protrusion 22p is at least a portion of a wedge (a fixing member) and protrudes toward the stator 10 with respect to the second recess 22r. Or, a wedge may be exposed at the bottom surface of the second recess 22r; and the second protrusion 22p may be a portion of an iron core protruding with respect to the wedge. The second recess 22r may be a fine slit provided between the second protrusions 22p.

The configuration of the rotor 20 is arbitrary as long as the multiple second protrusions 22p and the multiple second recesses 22r are provided in the second surface S2.

As illustrated in FIG. 1C, a robot 40 that is used in the inspection moves through the gap between the stator 10 and the rotor 20. The robot 40 moves along the first direction D1 and inspects the generator 1 interior. Continuing, the robot 40 moves in the rotation direction R. The robot 40 again moves along the first direction D1 and inspects the generator 1 interior. The generator 1 interior is sequentially inspected by alternately repeating the movement in the first direction D1 and the movement in the rotation direction R.

Figure 2:
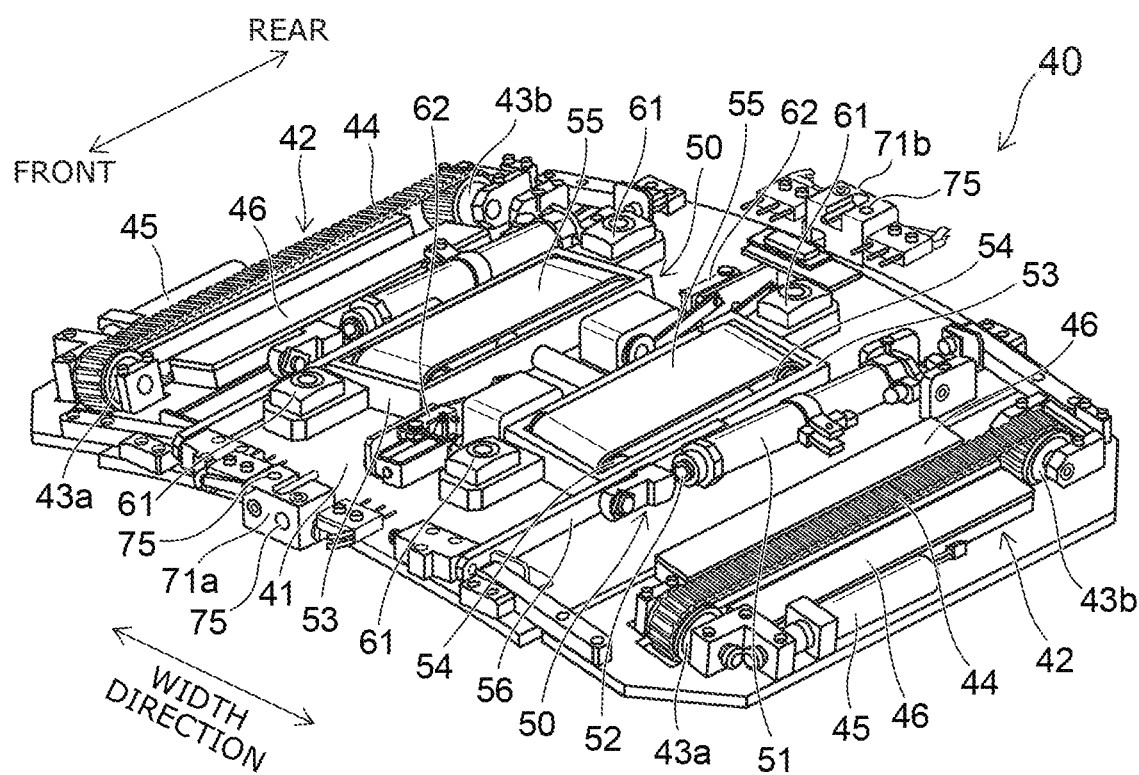
FIG. 2 is a perspective view illustrating the robot of the inspection system according to the embodiment.

FIG. 2 is a perspective view illustrating the robot of the inspection system according to the embodiment.

Figure 3:
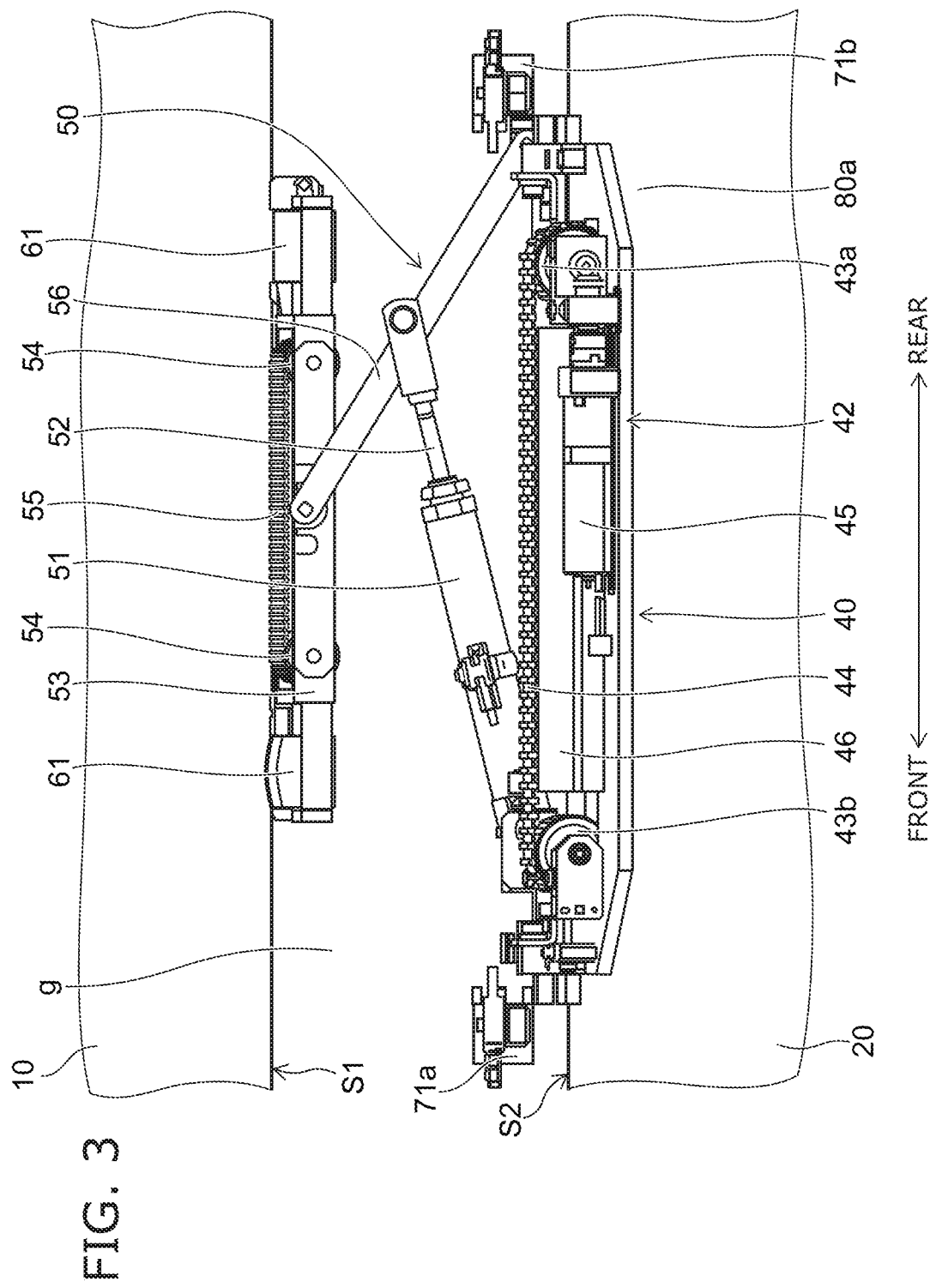
FIG. 3 is a side view illustrating the robot of the inspection system according to the embodiment.

FIG. 3 is a side view illustrating the robot of the inspection system according to the embodiment.

As illustrated in FIG. 2, the robot 40 includes a base plate 41, multiple movement mechanisms 42, a suction mechanism 46, and an inspection unit 50.

The base plate 41 is curved along the second surface S2.

The multiple movement mechanisms 42 are separated from each other in a width direction perpendicular to a frontward/rearward direction. Each of the movement mechanisms 42 includes a pair of pulleys 43a and 43b, a belt 44, and a motor 45.

The pulleys 43a and 43b are separated from each other in the frontward/rearward direction. The belt 44 is laid over the pulleys 43a and 43b. The belt 44 is exposed on the lower surface side (the rotor 20 side) of the base plate 41. For example, the motor 45 is linked to the pulley 43a and rotates the pulley 43a. By the rotation of the pulley 43a, the belt 44 is driven; and the robot 40 is moved. The movement direction of the robot 40 can be changed by adjusting the rotation amount of the pulley 43a of one of the movement mechanisms 42 and the rotation amount of the pulley 43a of the other of the movement mechanisms 42.

The suction mechanism 46 is disposed at the side of the belt 44. The robot 40 can be moved over the second surface S2 while being held on the second surface S2 via the suction mechanism 46. For example, the suction mechanism 46 performs electrostatic attachment utilizing static electricity or performs vacuum attachment utilizing a pressure difference. The robot 40 is moved or stopped on the second surface S2 by adjusting the drive force due to the movement mechanisms 42 and the holding force due to the suction mechanism 46.

The inspection unit 50 is provided on the base plate 41. For example, two inspection units 50 are provided and are separated from each other in the width direction. The inspection unit 50 includes an air cylinder 51, an arm 56, a travel guide described below, a sensor 61, and a sensor 62.

The arm 56 is linked to a drive rod 52 of the air cylinder 51. As illustrated in FIG. 3, one end portion of the arm 56 is moved vertically using the other end portion of the arm 56 as a fulcrum when the drive rod 52 is extended by the driving of the air cylinder 51.

A holder 53 is mounted to the one end portion of the arm 56. The sensors 61 and 62 are held by the holder 53. The travel guide also is held by the holder 53. The travel guide includes a pair of guide rollers 54 and a belt 55. The pair of guide rollers 54 is separated from each other in the frontward/rearward direction. The belt 55 is laid over the guide rollers 54.

A not-illustrated air pipe is connected to the air cylinder 51. A not-illustrated electrical cable is connected to the motor 45. Or, a battery may be mounted to the base plate 41; and the motor 45 may be driven by the battery.

The sensors 61 and 62 are, for example, electric sensors, acoustic sensors, mechanical sensors, etc. For example, the sensor 61 is an EL-CID (electro-magnetic core imperfection detector) sensor. The sensor 62 includes a hammering-test hammer driver. For example, the robot 40 inspects the generator 1 interior (the stator 10 and the rotor 20) by using the sensors 61 and 62 while moving over the second surface S2.

As illustrated in FIG. 2, the robot 40 further includes a camera 71a (an example of the imager), a camera 71b (another example of the imager), and an illuminator 75.

The cameras 71a and 71b image the first protrusion 11p. The camera 71a is provided at the vicinity of one end in the frontward/rearward direction of the robot 40. The camera 71b is provided at the vicinity of the other end in the frontward/rearward direction of the robot 40. The direction in which the camera 71b images is the reverse of the direction in which the camera 71a images. As described below, the illuminator 75 irradiates light on the first protrusion 11p. In the example illustrated in FIG. 2, the multiple illuminators 75 are provided at the camera 71a vicinity and the camera 71b vicinity.

The inspection system according to the embodiment will now be described.

Figure 4:
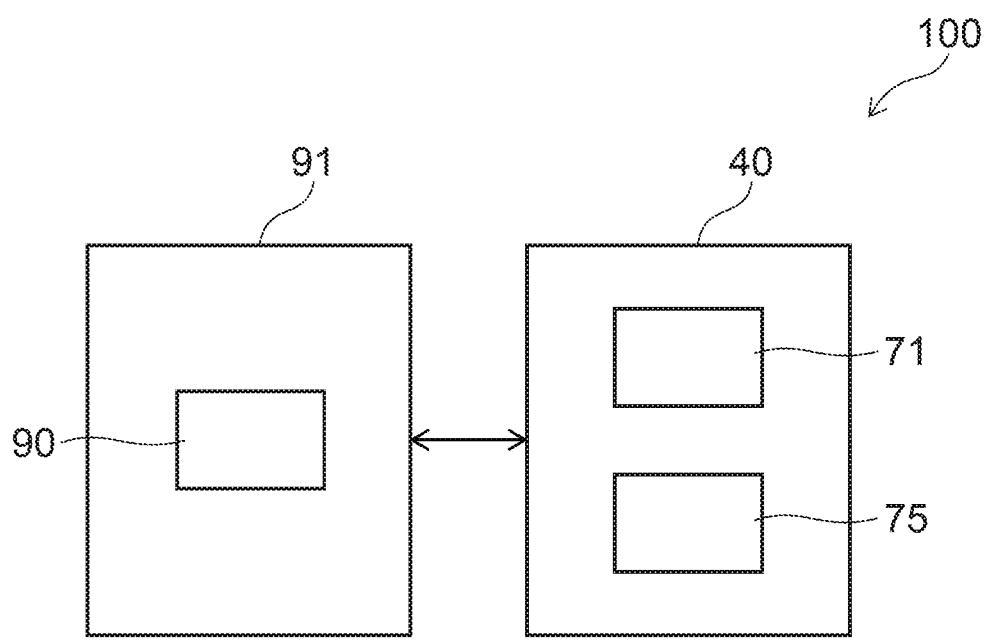
FIG. 4 is a block diagram illustrating the configuration of the inspection system according to the embodiment.

FIG. 4 is a block diagram illustrating the configuration of the inspection system according to the embodiment.

As illustrated in FIG. 4, the inspection system 100 according to the embodiment includes the robot 40 and a controller 90.

As described above, the robot 40 includes an imager 71 (e.g., the camera 71a or 71b) and the illuminator 75. For example, the robot 40 is connected by wired communication or wireless communication to a terminal 91 including the controller 90. The controller 90 transmits commands to the robot 40 and controls the operations of the robot 40.

Or, the inspection system 100 according to the embodiment may be realized by mounting the controller 90 in the robot 40.

The operations of the inspection system according to the embodiment will now be described with reference to FIG. 5 and FIGS. 6A to 6D.

Figure 5:
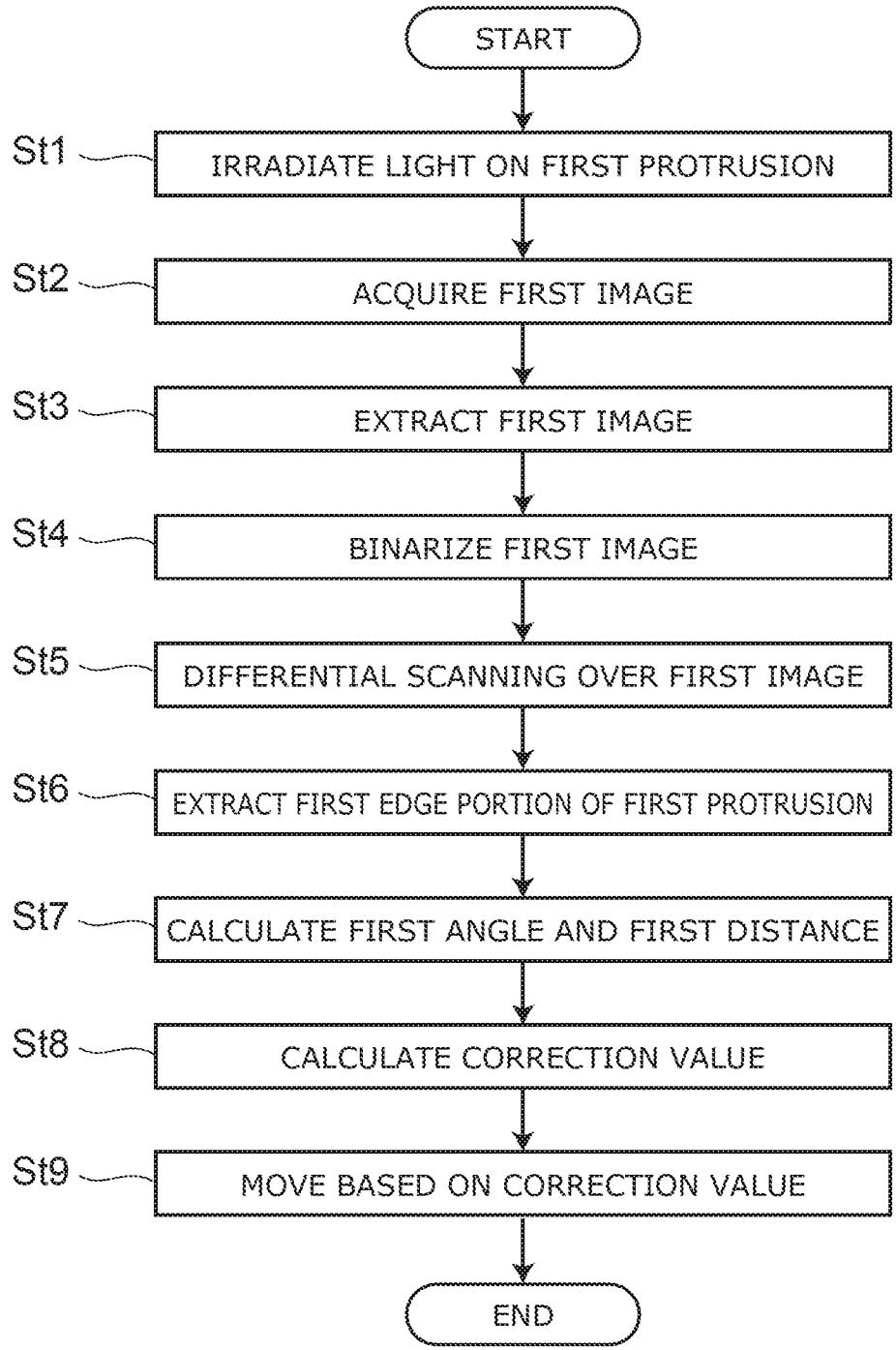
FIG. 5 is a flowchart illustrating the operations of the inspection system according to the embodiment.

FIG. 5 is a flowchart illustrating the operations of the inspection system according to the embodiment.

FIGS. 6A to 6D are schematic views illustrating the processing according to the inspection system according to the embodiment.

The illuminator 75 irradiates light on the first protrusion 11p (step a1). The imager 71 acquires the first image by imaging the first protrusion 11p illuminated by the light (step St2). FIG. 6A is an example of the first image. As illustrated in FIG. 6A, the first image may include the multiple first protrusions 11p and the multiple first recesses 11r.

In FIG. 6A, a region Re shows the region where the light is irradiated. In FIG. 6A, the density of the dots schematically illustrates the luminance. A greater density of the dots illustrates that the luminance is small.

In the case where much of the first image is a portion other than the illuminated first protrusion 11p, the controller 90 may extract a portion of the first image including the first protrusion 11p (step St3). For example, the controller 90 extracts, from the first image, an image that has a prescribed size and is centered on a preset point.

The controller 90 detects, in the first image, a first edge portion E1 in the rotation direction R of the first protrusion 11p by using the difference between the luminance of the illuminated first protrusion 11p and the luminance of another portion. The first image is the image acquired in step St2 or the image extracted in step St3.

An example of the method for detecting the first edge portion E1 based on the luminance will now be described. First, the controller 90 binarizes the first image (step St4). As illustrated in FIG. 6A, the luminance of the illuminated first protrusion 11p is higher than the luminance of the other portion. For example, by binarizing the first image, the illuminated first protrusion 11p is illustrated by white and the other portion is illustrated by black as illustrated in FIG. 6B.

The controller 90 performs differential scanning along the rotation direction R over the binarized first image (step St5). Thereby, the change rate of the luminance (the brightness) on the first image is calculated. As an example, the change rate of the luminance between adjacent pixels is calculated. Or, the average value of the luminances of multiple pixels may be calculated; and the change rate of the average values between adjacent pixel groups may be calculated. The controller 90 extracts the locations where the change rate is a prescribed threshold or more.

The differential scanning of the entire region of the first image is performed; and multiple locations where the change rate is the prescribed threshold or more are extracted. Thereby, as illustrated in FIG. 6C, the first edge portion E1 in the rotation direction R of the first protrusion 11p is extracted (step St6).

As illustrated in FIG. 6D, the controller 90 calculates a first angle $\theta1$ of the first edge portion E1 and a first distance Di1 between the first edge portion E1 and a reference point SP (step St7). The first angle $\theta1$ is taken to be the angle between a reference line SL and a line L1 passing through the first edge portion E1. The reference line SL is, for example, a straight line aligned with the lower edge of the first image. The first distance Di1 is taken to be the distance between the reference point SP and the line L1 on a line perpendicular to the line L1 and passing through the reference point SP. The reference point SP is, for example, a point at the upper-left edge of the first image.

Based on the first angle 81 and the first distance Di1, the controller 90 calculates a correction value necessary for the robot 40 to move along the first direction D1 through the appropriate position (step St8).

An example of the method for calculating the correction value will now be described.

First, before acquiring the first image, the imager 71 acquires a second image by imaging the first protrusion 11p. The second image is acquired in a state in which the robot 40 is disposed at an appropriate position in the rotation direction R and can move along the first direction D1. The first protrusion 11p that appears in the second image is the same as the first protrusion 11p appearing in the first image. The portion that appears in the second image may be different from the portion appearing in the first image. For example, the second image is acquired when the robot 40 starts to move toward the first direction D1.

Similarly to the first image, the controller 90 extracts the first edge portion E1 of the first protrusion 11p included in the second image. Then, the controller 90 calculates the second angle of the first edge portion E1 and the second distance between the first edge portion E1 and the reference point SP in the second image. A large difference between the first angle $\theta1$ and the second angle shows that the tilt of the movement direction of the robot 40 with respect to the first direction D1 is large. A large difference between the first distance Di1 and the second distance shows that the tilt of the movement direction of the robot 40 with respect to the first direction D1 or the shift from the appropriate position in the rotation direction R of the robot 40 is large.

For example, before calculating the first angle and the first distance, the controller 90 calculates the second angle and the second distance and stores the second angle and the second distance in a not-illustrated memory. When the controller 90 has calculated the first angle and the first distance, the controller 90 refers to the second angle and the second distance that are stored. The controller 90 calculates a correction value to reduce the difference between the first angle $\theta1$ and the second angle and the difference between the first distance Di1 and the second distance. For example, the correction value is taken to be the drive amount of each of the pair of movement mechanisms 42 illustrated in FIG. 2.

Or, a reference angle and a reference distance for the robot 40 moving along the first direction D1 may be preset. In such a case, the controller 90 calculates the correction value to reduce the difference between the first angle $\theta1$ and the reference angle and the difference between the first distance Di1 and the reference distance.

Or, the controller 90 may detect changes of the first angle $\theta1$ and the first distance Di1 when the robot 40 moves and may calculate the correction value to correct the changes.

The robot 40 moves based on the calculated correction value (step St9). Thereby, the robot 40 can move along the first direction D1 at the appropriate position in the rotation direction R.

Ultimately, it is sufficient for the difference between the first angle $\theta1$ and the second angle (the reference angle) and the difference between the first distance Di1 and the second distance (the reference distance) to be small. In the correction process of these differences, at least one of these differences may increase temporarily.

Effects of the embodiment will now be described.

As described above, the robot 40 inspects the interior of the generator 1 by repeating the movement in the first direction D1 and the movement in the rotation direction R. When the movement direction of the robot 40 has a tilt with respect to the first direction D1 or the position in the rotation direction R of the robot 40 is shifted, a portion where the generator 1 is not inspected may occur. To inspect the generator 1 more accurately, it is desirable for the robot 40 to move along the first direction D1 through the appropriate positions in the rotation direction R.

According to the inspection system 100 according to the embodiment, as described above, based on the first image imaged by the imager 71, the tilt with respect to the first direction D1 of the movement direction of the robot 40 and the misalignment in the rotation direction R of the robot 40 can be small. Thereby, for example, even in the case where the tilt with respect to the first direction D1 of the movement direction of the robot 40 is large, the controller 90 can control the movement of the robot 40 to reduce the tilt. Accordingly, according to the inspection system 100 according to the embodiment, it is possible to perform the inspection of the generator 1 with higher reliability.

As described above, it is desirable for the correction value for reducing the tilt and misalignment to be calculated based on both the first angle $\theta1$ and the first distance Di1. This is because the tilt and the misalignment after the correction can be smaller.

However, the correction value recited above may be calculated based on only one of the first angle $\theta1$ or the first distance Di1. In such a case as well, the tilt and the misalignment can be small compared to the case where the correction is not executed.

When imaging the first image, the interior of the generator 1 may be illuminated from outside the generator 1. Or, as illustrated in FIG. 4, the robot 40 may include the illuminator 75. By including the illuminator 75 in the robot 40, the generator 1 interior can be illuminated at a more proximal position. Thereby, the first edge portion E1 can be extracted more accurately.

The illuminator 75 may illuminate multiple first protrusions 11p. In such a case, the first edge portion E1 is extracted for each of the multiple first protrusions 11p. The controller 90 calculates each first angle of the first edge portion E1 and each first distance between the first edge portion E1 and the reference point SP. The controller 90 calculates each second angle of the first edge portion E1 and each second distance between the first edge portion E1 and the reference point SP in the pre-imaged second image. The controller 90 calculates the correction value to reduce each difference between the multiple first angles and the multiple second angles and each difference between the multiple first distances and the multiple second distances. At this time, for example, the controller 90 respectively compares the first angle and the first distance of the nth first edge portion E1 from the left in the first image and the second angle and the second distance of the nth first edge portion E1 from the left in the second image.

By controlling the movement of the robot 40 based on the multiple first protrusions 11p, the tilt with respect to the first direction D1 of the movement direction of the robot 40 and the misalignment in the rotation direction R of the robot 40 can be reduced further.

Figure 7:
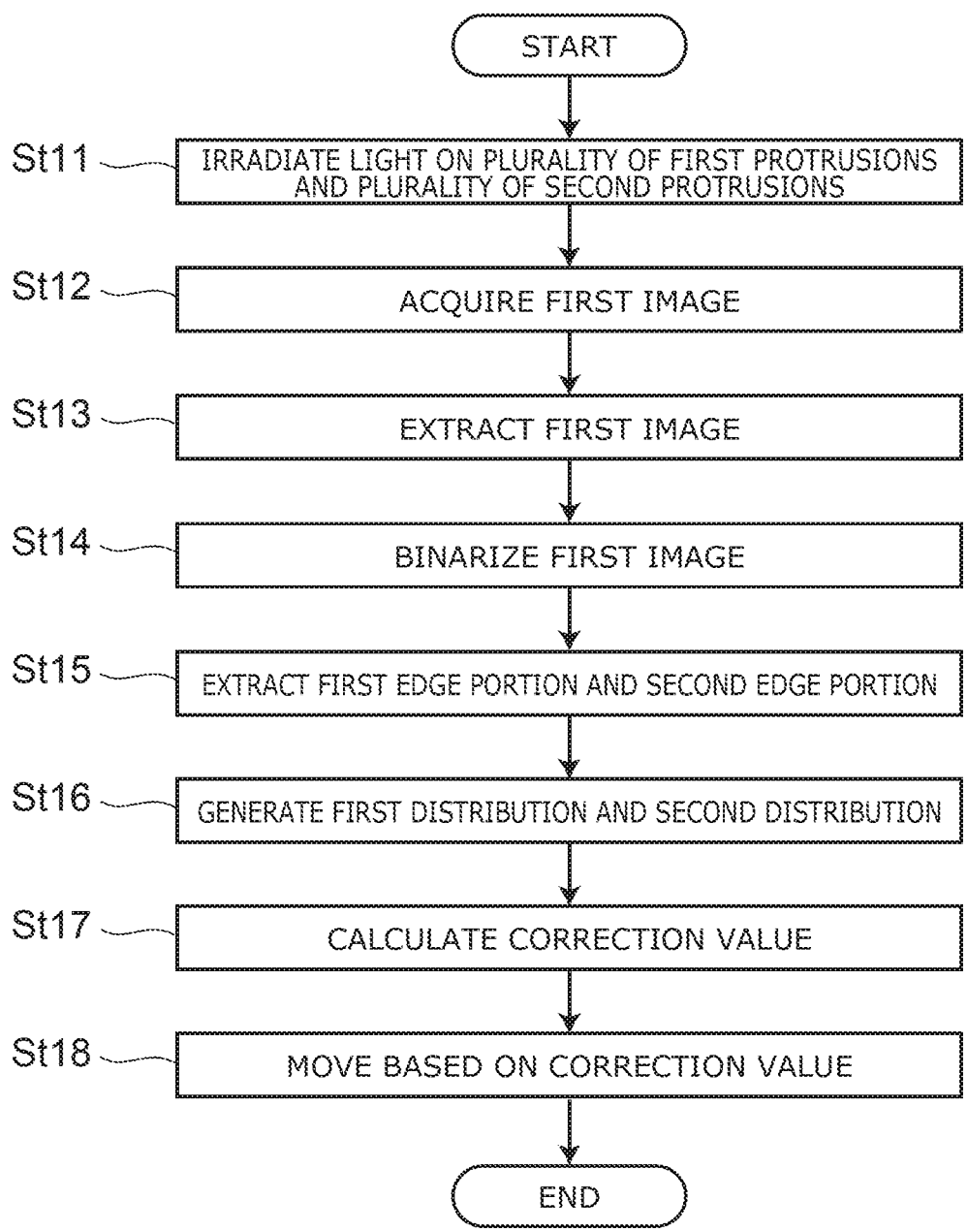
FIG. 7 is a flowchart illustrating other operations of the inspection system according to the embodiment.

Or, the inspection system 100 according to the embodiment may similarly calculate the correction value using the second protrusion 22p provided in the second surface S2 of the rotor 20. In such a case, the operations illustrated in the flowchart of FIG. 7 are executed for the second protrusion 22p. Or, the inspection system 100 according to the embodiment may calculate the correction value using both the first protrusion 11p and the second protrusion 22p.

In such a case as well, the tilt and the shift can be small compared to the case where the correction is not performed.

The robot 40 may inspect the generator 1 by moving over the first surface S1. However, a baffle that extends along the rotation direction R is provided at the first surface S1 of the stator 10. The movement of the robot 40 is limited by the baffle in the case where the robot 40 moves over the first surface S1. Accordingly, it is desirable for the robot 40 to inspect the generator 1 by moving over the second surface S2.

Modification

The operations described below may be executed in the inspection system 100 according to the embodiment.

FIG. 7 is a flowchart illustrating other operations of the inspection system according to the embodiment.

Figure 8A:
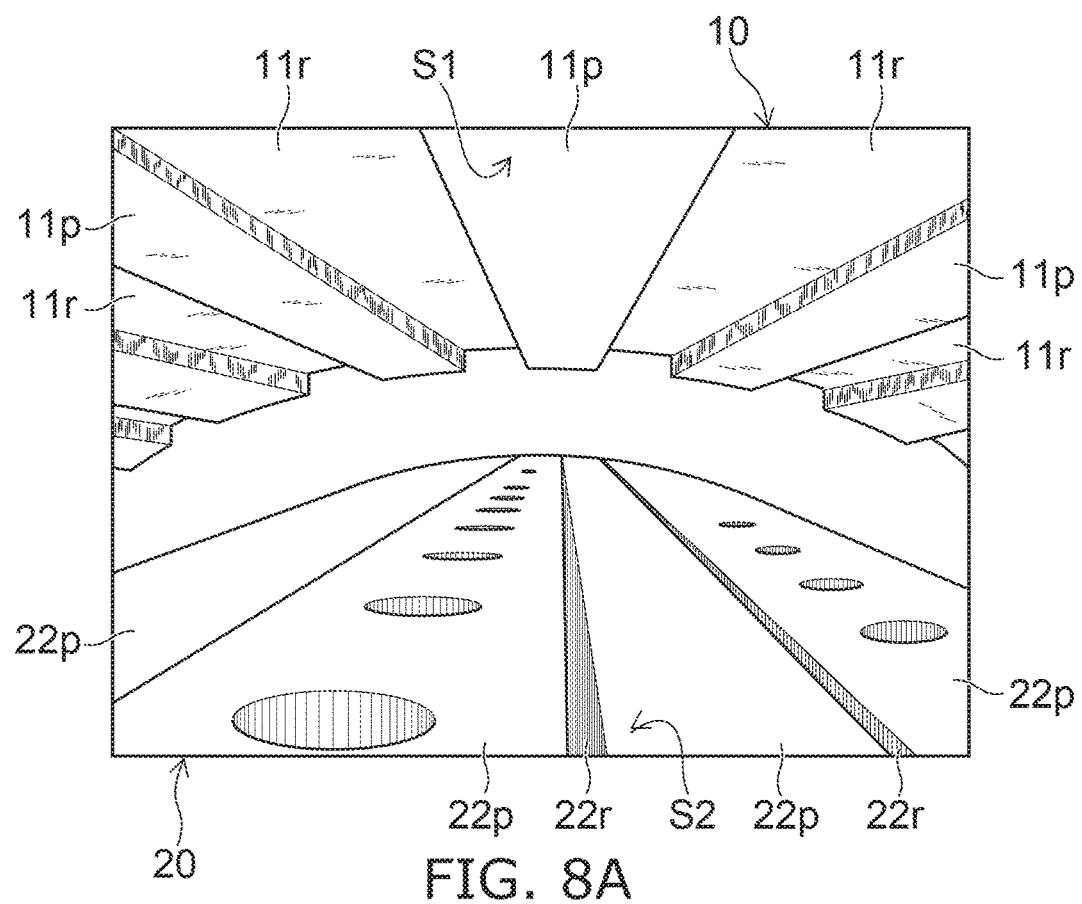
FIGS. 8A and 8B are schematic views illustrating another processing according to the inspection system according to the embodiment.
Figure 8B:
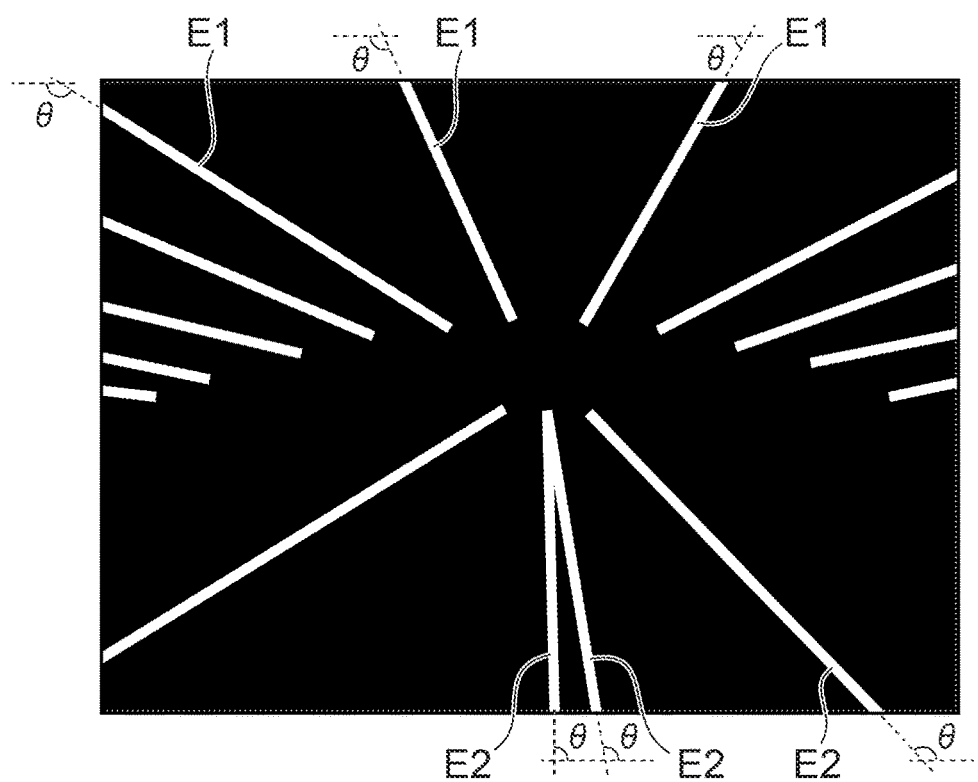

FIGS. 8A and 8B are schematic views illustrating another processing according to the inspection system according to the embodiment.

Figure 9A:
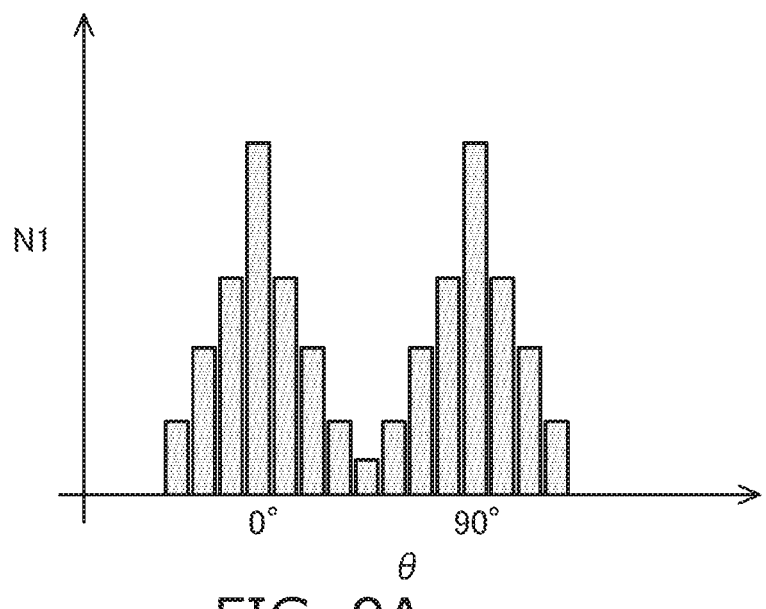
FIGS. 9A and 9B are schematic views illustrating a first distribution and a second distribution.
Figure 9B:
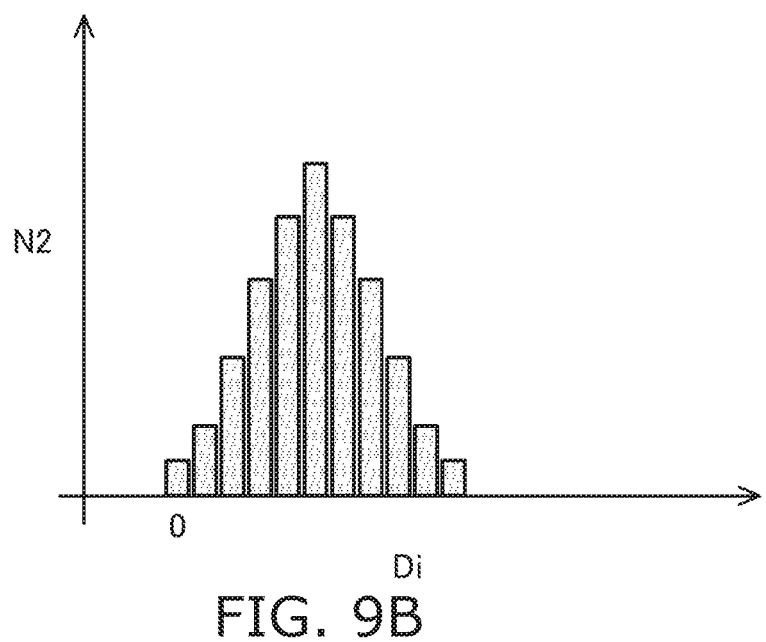

FIGS. 9A and 9B are schematic views illustrating a first distribution and a second distribution.

First, the illuminator 75 irradiates light on the multiple first protrusions 11p and the multiple second protrusions 22p (step St11). The imager 71 acquires the first image by imaging the illuminated multiple first protrusions 11p and the illuminated multiple second protrusions 22p (step St12). FIG. 8A schematically illustrates the first image.

The controller 90 may extract a portion of the acquired first image (step St13). The controller 90 binarizes the first image (step St14). Based on the binarized first image, the controller 90 extracts the first edge portions E1 of the multiple first protrusions 11p and second edge portions E2 of the multiple second protrusions 22p as illustrated in FIG. 8B (step St15). For example, the multiple first edge portions E1 and the multiple second edge portions E2 are extracted by performing a Hough transform of the first image.

The controller 90 calculates each angle of the multiple first edge portions E1 and the multiple second edge portions E2 and each distance between the reference point and the multiple first edge portions E1 and the multiple second edge portions E2. Then, the controller 90 generates the first distribution of the multiple angles and the second distribution of the multiple distances (step St16).

For example, each angle θ of the first edge portions E1 is taken to be the angle between a vector line passing through the first edge portion E1 toward the center of the first image and a vector line toward the left edge of the first image and parallel to the upper edge of the first image. Each angle θ of the second edge portions E2 is taken to be the angle between a vector line passing through the second edge portion E2 toward the center of the first image and a vector line toward the right edge of the first image and parallel to the lower edge of the first image. Similarly to the example illustrated in FIG. 6D, each distance between the reference point and the multiple first edge portions E1 and the multiple second edge portions E2 is taken to be each distance between the reference point and the line passing through the edge portion on a perpendicular line passing through the reference point.

FIG. 9A illustrates an example of the first distribution; and FIG. 9B illustrates an example of the second distribution.

The first distribution illustrates the relationship between the size of the angle θ and a number of times N1 that the angles are detected. The second distribution illustrates the relationship between the size of a distance Di and a number of times N2 that the distances are detected.

For example, the inspection system 100 calculates the multiple angles recited above and the multiple distances recited above while moving the robot 40 for a preset first time. The controller 90 determines the cumulative detection count of each angle and the cumulative detection count of each distance for the first time. The controller 90 generates the first distribution and the second distribution based on the calculated results. As an example, the first time is set to be not less than 30 milliseconds and not more than 1 second.

The first distribution and the second distribution are substantially normal distributions. In the case where the reference line is set to the lower edge (or the upper edge) of the first image, the first distribution includes peaks at the vicinity of 0 degrees and the vicinity of 90 degrees. In the case where the reference point is set to the upper-left edge of the image, the second distribution has a peak at a value greater than 0.

The controller 90 calculates the correction value based on the first distribution and the second distribution (step St17). For example, the peak positions and the peak widths of the first distribution and the second distribution are dependent on the tilt with respect to the first direction D1 of the movement direction of the robot 40 and the position in the rotation direction R of the robot 40. For example, when the tilt becomes large and the shift from the appropriate position in the rotation direction R becomes large, the peak positions shift; and the peak widths widen. The controller 90 calculates the correction value by utilizing this characteristic.

One specific example of the method for calculating the correction value will now be described.

First, before acquiring the first image, the imager 71 acquires the second image by imaging the multiple first protrusions 11p and the multiple second protrusions 22p. The second image is acquired in a state in which the robot 40 is disposed at an appropriate position in the rotation direction R and can move along the first direction D1.

Similarly to the first image, the controller 90 extracts the first edge portions E1 of the multiple first protrusions 11p and the second edge portions E2 of the multiple second protrusions 22p included in the second image. Then, the controller 90 calculates each angle of the multiple first edge portions E1 and the multiple second edge portions E2 and each distance between the reference point and the multiple first edge portions E1 and the multiple second edge portions E2 in the second image. Then, the controller 90 generates a third distribution of the multiple angles and a fourth distribution of the multiple distances based on the second image.

For example, before generating the first distribution and the second distribution, the controller 90 generates the third distribution and the fourth distribution and stores the third distribution and the fourth distribution in a not-illustrated memory. When the controller 90 has generated the first distribution and the second distribution, the controller 90 refers to the third distribution and the fourth distribution that are stored. The controller 90 calculates the correction value to cause the first distribution to approach the third distribution and to cause the second distribution to approach the fourth distribution. More specifically, the controller 90 calculates the correction value to reduce the difference between the peak position of the first distribution and the peak position of the third distribution, the difference between the peak width of the first distribution and the peak width of the third distribution, the difference between the peak position of the second distribution and the peak position of the fourth distribution, and the difference between the peak width of the second distribution and the peak width of the fourth distribution.

Or, a first reference distribution of the multiple angles and a second reference distribution of the multiple distances may be preset for the robot 40 moving along the first direction D1. In such a case, the controller 90 calculates the correction value to cause the peak position and the peak width of the first distribution respectively to approach the peak position and the peak width of the first reference distribution and to cause the peak position and the peak width of the second distribution respectively to approach the peak position and the peak width of the second reference distribution.

Or, the controller 90 may detect changes of the first distribution and the second distribution when the robot 40 moves and may calculate the correction value to correct the changes.

The robot 40 moves based on the calculated correction value (step St9). Thereby, the robot 40 can move along the first direction D1 at the appropriate position in the rotation direction R.

Ultimately, it is sufficient for the shift between the first distribution and the third distribution (the first reference distribution) and the shift between the second distribution and the fourth distribution (the second reference distribution) to be small. In the correction process, the shifts of these distributions may increase temporarily.

In the method described above as well, the tilt with respect to the first direction D1 of the movement direction of the robot 40 and the misalignment in the rotation direction R of the robot 40 can be small. By using the multiple first edge portions E1 and the multiple second edge portions E2, the tilt and the shift can be small even in the case where an error occurs in the detection of the edge portion of one of the first edge portion E1 or the second edge portion E2.

It is desirable for the correction value for reducing the tilt and misalignment to be calculated using the multiple first edge portions E1 and the multiple second edge portions E2. This is because the tilt and the misalignment after the correction can be smaller.

However, the correction value recited above may be calculated using only one of the multiple first edge portions E1 or the multiple second edge portions E2. In such a case as well, the tilt and the misalignment can be small compared to the case where the correction is not executed.

The case is described in the examples described above where the inspection system according to the embodiment is used to inspect a generator. The invention according to the embodiment is not limited to such an example. The inspection system according to the embodiment is applicable also to equipment other than a generator as long as at least one of the first protrusion or the second protrusion is provided and there is a space through which the robot can move.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A controller controlling a robot movable between a first structural object and a second structural object, the first structural object extending in a first direction, the second structural object being provided around the first structural object and having a first surface opposing the first structural object, a first protrusion being provided in the first surface and extending in the first direction,
   in a case that a first image of the first protrusion is acquired by an imager attached on the robot, the controller detecting a first edge portion of the first protrusion in a circumferential direction from the first image, the circumferential direction being around the first direction,
   the controller controlling a movement of the robot by using the detected first edge portion.

2. The controller according to claim 1, wherein
the controller
   calculates a first angle of the first edge portion in the first image,
   refers to a second angle of the first edge portion in a second image of the first protrusion, the second image being pre-imaged, and
   controls the movement to reduce a difference between the first angle and the second angle.

3. The controller according to claim 2, wherein
the controller further
   calculates a first distance between the first edge portion and a reference point in the first image,
   refers to a second distance between the first edge portion and the reference point in the second image, and controls the movement to reduce a difference between the first distance and the second distance.

4. The controller according to claim 1, wherein the controller
calculates a first distance between the first edge portion and a reference point in the first image,
refers to a second distance between the first edge portion and the reference point in a second image of the first protrusion, the second image being pre-imaged, and
controls the movement to reduce a difference between the first distance and the second distance.

5. The controller according to claim 1, wherein the controller
calculates a first angle of the first edge portion in the first image,
detects a change of the first angle accompanying the movement, and
controls the movement to correct the change.

6. The controller according to claim 1, wherein the controller
calculates a first distance between the first edge portion and a reference point in the first image,
detects a change of the first distance accompanying the movement, and
controls the movement to correct the change.

7. The controller according to claim 1, wherein
a plurality of the first protrusions is provided in the circumferential direction, and
the controller detects the first edge portion for each of the plurality of first protrusions from the first image, and controls the movement of the robot by using the detected plurality of first edge portions.

8. The controller according to claim 1, wherein
the controller detects, in the first image, the first edge portion by using a difference between a luminance of the first protrusion and a luminance of another portion.

9. The controller according to claim 8, wherein the controller
binarizes the first image,
detects a change rate of the luminance in the circumferential direction of the first image, and
detects, as the first edge portion, a location where the change rate is not less than a threshold.

10. A mobile robot, comprising:
the controller according to claim 1; and
the robot.

11. An inspection system, comprising:
the controller according to claim 1; and
the robot including an inspection unit and inspecting the first structural object or the second structural object using the inspection unit.

12. The inspection system according to claim 11, further comprising an illuminator,
the illuminator illuminating the first protrusion when the first image is acquired.

13. A controlling method for controlling a robot movable between a first structural object and a second structural object, the first structural object extending in a first direction, the second structural object being provided around the first structural object and having a first surface opposing the first structural object, a first protrusion being provided in the first surface and extending in the first direction, the controlling method comprising:
in a case that a first image of the first protrusion is acquired by an imager attached on the robot, detecting a first edge portion of the first protrusion in a circumferential direction from the first image, the circumferential direction being around the first direction; and
controlling a movement of the robot by using the detected first edge portion.

14. The controlling method according to claim 13, wherein
a first angle of the first edge portion in the first image is calculated,
a second angle of the first edge portion in a second image of the first protrusion is referred to, the second image being pre-imaged, and
the movement is controlled to reduce a difference between the first angle and the second angle.

15. The controlling method according to claim 14, wherein
a first distance between the first edge portion and a reference point in the first image is calculated,
a second distance between the first edge portion and the reference point in the second image is referred to, and
the movement is controlled to reduce a difference between the first distance and the second distance.

16. The controlling method according to claim 13, wherein
a first distance between the first edge portion and a reference point in the first image is calculated,
a second distance between the first edge portion and the reference point in a second image of the first protrusion is referred, the second image being pre-imaged, and
the movement is controlled to reduce a difference between the first distance and the second distance.

17. The controlling method according to claim 13, wherein
a first angle of the first edge portion is calculated in the first image,
a change of the first angle accompanying the movement is detected, and
the movement is controlled to correct the change.

18. The controlling method according to claim 13, wherein
a first distance between the first edge portion and a reference point in the first image is calculated,
a change of the first distance accompanying the movement is detected, and
the movement is controlled to correct the change.

19. The controlling method according to claim 13, wherein
a plurality of the first protrusions is provided in the circumferential direction,
the first edge portion for each of the plurality of first protrusions is detected from the first image, and
the movement of the robot is controlled by using the detected plurality of first edge portions.

20. The controlling method according to claim 13, wherein
the first edge portion in the first image is detected by using a difference between a luminance of the first protrusion and a luminance of another portion.

21. The controlling method according to claim 20, wherein
the first image is binarized,
a change rate of the luminance in the circumferential direction of the first image is detected, and
a location where the change rate is not less than a threshold is detected as the first edge portion.

22. A non-transitory computer readable medium storing a program, the program causing a computer to perform the controlling method according to claim 13.

\* \* \* \* \*